United States Patent
Johnson et al.

(10) Patent No.: US 9,164,158 B2
(45) Date of Patent: Oct. 20, 2015

(54) CALIBRATION DEVICE

(71) Applicant: Teradyne, Inc., North Reading, MA (US)

(72) Inventors: Gerald H. Johnson, Andover, MN (US); Babak Nikoomanesh, Westlake Village, CA (US); Chiyi Jin, Thousand Oaks, CA (US); Wolfgang Maichen, Regensburg (DE)

(73) Assignee: Teradyne, Inc., North Reading, MA (US)

( * ) Notice: Subject to any disclaimer, the term of this patent is extended or adjusted under 35 U.S.C. 154(b) by 319 days.

(21) Appl. No.: 13/912,630

(22) Filed: Jun. 7, 2013

(65) Prior Publication Data

US 2014/0361798 A1    Dec. 11, 2014

(51) Int. Cl.
*G01R 31/00* (2006.01)
*G01R 35/00* (2006.01)
*G01R 31/319* (2006.01)

(52) U.S. Cl.
CPC .......... *G01R 35/005* (2013.01); *G01R 31/3191* (2013.01)

(58) Field of Classification Search
CPC ............. G01R 35/005; G01R 31/3191; G01R 31/2841; G01R 31/31922; G01R 31/31937; G01R 35/00; G01K 11/006
See application file for complete search history.

(56) References Cited

U.S. PATENT DOCUMENTS

| | | | |
|---|---|---|---|
| 5,058,087 A | 10/1991 | Welzhofer | |
| 6,609,077 B1 | 8/2003 | Brown et al. | |
| 8,373,432 B2 | 2/2013 | Johnson | |
| 8,928,333 B2 * | 1/2015 | Atkinson et al. | 324/601 |
| 2002/0199141 A1 | 12/2002 | Lemlein et al. | |
| 2007/0022350 A1 | 1/2007 | McAuliffe | |
| 2008/0125998 A1 | 5/2008 | Huang et al. | |
| 2008/0231297 A1 | 9/2008 | Kang | |
| 2010/0324845 A1 * | 12/2010 | Spanier et al. | 702/62 |
| 2012/0313618 A1 | 12/2012 | Phillips | |

OTHER PUBLICATIONS

International Search Report and Written Opinion mailed Sep. 17, 2014 in international application No. PCT/US2014/038960, 15 pgs.

* cited by examiner

*Primary Examiner* — Tung X Nguyen
(74) *Attorney, Agent, or Firm* — Fish & Richardson P.C.

(57) ABSTRACT

An example apparatus is for use in calibration of a test system having multiple channels and a socket for receiving a device under test. The example apparatus includes a device interface that is connectable to the socket; and multiple circuit paths, where each circuit path is connectable, through the device interface, to a corresponding channel of the test system and being connected to a common node. The example apparatus is configured so that, during calibration, signals either (i) each pass from the test system, through one of the multiple circuit paths, and back to the test system through others of the multiple circuit paths, or (ii) each pass from the test system, through the others of the multiple circuit paths, and back to the test system through the one of the multiple circuit paths.

30 Claims, 5 Drawing Sheets

CALIBRATION DEVICE

TECHNICAL FIELD

This specification relates generally to a calibration device for a test system.

BACKGROUND

ATE refers to an automated, usually computer-driven, system for testing devices, such as semiconductors, electronic circuits, and printed circuit board assemblies. A device tested by ATE is referred to as a device under test (DUT).

ATE typically includes a computer system and a testing device or a single device having corresponding functionality. ATE is capable of providing test signals to a DUT, receiving response signals from the DUT, and forwarding those response signals for processing to determine whether the DUT meets testing qualifications.

Calibration can affect the performance of ATE. For example, ATE may be calibrated to achieve timing accuracy. In ATE, timing accuracy includes, among other things, applying signals to a DUT that meet predefined timing constraints. For example, the rising edge of a signal may need to reach the DUT within a specified time-frame in order to test the DUT accurately. As the operational speeds of DUTs increase, timing accuracy becomes more critical, since there is typically less tolerance for signal time variations during testing.

Typically, timing deskew calibration (e.g., alignment of signal timing between tester channels) uses either time domain reflectometry (TDR) which may include sending a pulse into a channel and looking for a reflection, or a robotic calibration at the tester interface combined with off-line measurement of delay through a load board. Both methods suffer from measurement errors that make it difficult to achieve skews in the picosecond range. This is because, in both methods, the timing measurement is not done where the DUT is located during test time, e.g., in the DUT socket. Some types of calibration use probing at the socket landing pattern, but this typically requires removal of the socket before each calibration, which is time consuming and can wear out the load board, and still does not necessarily achieve timing where the DUT resides. This also requires external equipment such as probes, cables, test instruments, etc.

SUMMARY

An example apparatus is for use in calibration of a test system comprising multiple channels and a socket for receiving a device under test. The example apparatus comprises a device interface that is connectable to the socket; and multiple circuit paths, each of which is connectable, through the device interface, to a corresponding channel of the test system and is connected to a common node. The apparatus is configured so that, during calibration, signals either (i) each pass from the test system, through one of the multiple circuit paths, and back to the test system through others of the multiple circuit paths, or (ii) each pass from the test system, through the others of the multiple circuit paths, and back to the test system through the one of the multiple circuit paths. The example apparatus may include one or more of the following features, either alone or in combination.

The others of the multiple circuit paths may comprise all of the multiple circuit paths except the one of the multiple circuit paths. In a case that signals each pass from the test system, through one of the multiple circuit paths: successive signals pass back to the test system through different ones of the multiple circuit paths. In a case that signals each pass from the test system, through the others of the multiple circuit paths: successive signals pass through different ones of the others of the multiple circuit paths. Each of the multiple circuit paths may comprise a circuit trace and/or an impedance element. The impedance element may comprise a resistor that is part of a resistive divider network that includes the common node. The resistor may be chosen from a group consisting of embedded resistors, surface-mounted resistors, and thin-film resistors. A combination of impedance elements along with driver impedance and load impedance of receiving channels may comprise a matched impedance network.

The apparatus may have a package size that is the same as a package size of the device under test. Calibration may comprise aligning timing of channels by varying timing using pin electronics in the test system. The apparatus may calibrate channels in the test system so that the channels of the test system have a timing misalignment of, at most, five picoseconds.

An example test system may comprise channels for sending signals to, and receiving signals from, a device under test (DUT), where each channel comprises pin electronics to send test signals to the DUT and to receive response signals from the DUT, and each channel comprises at least one variable delay element to adjust a timing of a corresponding channel. The example test system may comprise a socket to interface the channels to the DUT; and a calibration device connected in the socket in place of the DUT, where the calibration device is for calibrating the test system. The calibration device may comprise a device interface that is connectable to the socket; and multiple circuit paths, each of which is connectable, through the device interface, to a corresponding channel of the test system and being connected to a common node. The apparatus may be configured so that, during calibration, signals either (i) each pass from the test system, through one of the multiple circuit paths, and back to the test system through others of the multiple circuit paths, or (ii) each pass from the test system, through the others of the multiple circuit paths, and back to the test system through the one of the multiple circuit paths. The example test system may include one or more of the following features, either alone or in combination.

The others of the multiple circuit paths may comprise all of the multiple circuit paths except the one of the multiple circuit paths. The pin electronics of each channel may comprise a pin driver for outputting the test signals and a comparator circuit for receiving the test signals. In a case that signals each pass from the test system, through one of the multiple circuit paths: successive signals pass back to the test system through different ones of the multiple circuit paths. In a case that signals each pass from the test system, through the others of the multiple circuit paths: successive signals pass through different ones of the others of the multiple circuit paths. Each of the multiple circuit paths may comprise a circuit trace. Each of the multiple circuit paths may comprise an impedance element. The impedance element may comprise a resistor that is part of a resistive divider network that includes the common node. A combination of impedance elements along with driver impedance and load impedance of receiving channels may comprise a matched impedance network.

The calibration device may have a package size that is the same as a package size of the DUT. Calibration may comprise aligning timing of a channel by changing delay provided by a variable delay element in the channel. The calibration device may calibrate channels in the test system so that the channels of the test system have a timing misalignment of, at most, five picoseconds.

An example method of calibrating a test system comprising multiple channels and a socket for receiving a device under test uses an apparatus comprising: a device interface that is connectable to the socket; and multiple circuit paths, each of which is connectable, through the device interface, to a corresponding channel of the test system and is connected to a common node. The example method comprises: passing signals from the test system such that each signal passes through one of the multiple circuit paths, and back to the test system through others of the multiple circuit paths; determining timing information based on passage of the signals; and determining calibration information based on the timing information.

The example method may include one or more of the following features, either alone or in combination. The others of the multiple circuit paths may comprise all of the multiple circuit paths except the one of the multiple circuit paths. Determining the timing information may comprise incorporating the timing information into a system of equations, and solving for the calibration information by solving the system of equations.

An example method of calibrating a test system comprising multiple channels and a socket for receiving a device under test uses an apparatus comprising: a device interface that is connectable to the socket; and multiple circuit paths, each of which is connectable, through the device interface, to a corresponding channel of the test system and is connected to a common node. The example method comprises: passing signals from the test system such that each signal passes through a set of the multiple circuit paths, and back to the test system through the one of the multiple circuit paths; determining timing information based on passage of the signals; and determining calibration information based on the timing information.

The example method may include one or more of the following features, either alone or in combination. The set of the multiple circuit paths may comprise all of the multiple circuit paths except the one of the multiple circuit paths. Determining the timing information may comprise incorporating the timing information into a system of equations, and solving for the calibration information by solving the system of equations.

Any two or more of the features described in this specification, including in this summary section, can be combined to form implementations not specifically described herein.

The systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Manufacturers generally test devices at various stages of manufacture. In an example manufacturing process, integrated circuits are fabricated in large quantities on a single silicon wafer. The wafer is cut into individual integrated circuits called dice. Each die is loaded into a frame, and bonding wires are attached to connect the die to leads that extend from the frame. The loaded frame is then encapsulated in plastic or another packaging material to produce a finished product.

Manufacturers have an economic incentive to detect and discard faulty components as early as possible in the manufacturing process. Accordingly, many manufacturers test integrated circuits at the wafer level, before a wafer is cut into dice. Defective circuits are marked and generally discarded prior to packaging, thus saving the cost of packaging defective dice. As a final check, many manufacturers test each finished product before it is shipped. Such a process tests parts in packages which have had additional expense added to them over bare die. So, having accurate test results reduces the need to discard valuable parts.

To test quantities of components, manufacturers commonly use ATE (or "testers"). In response to instructions in a test program, ATE automatically generates input signals to be applied to a DUT, and monitors output signals. The ATE compares the output signals with expected responses to determine whether the DUT is defective.

Figure 1:
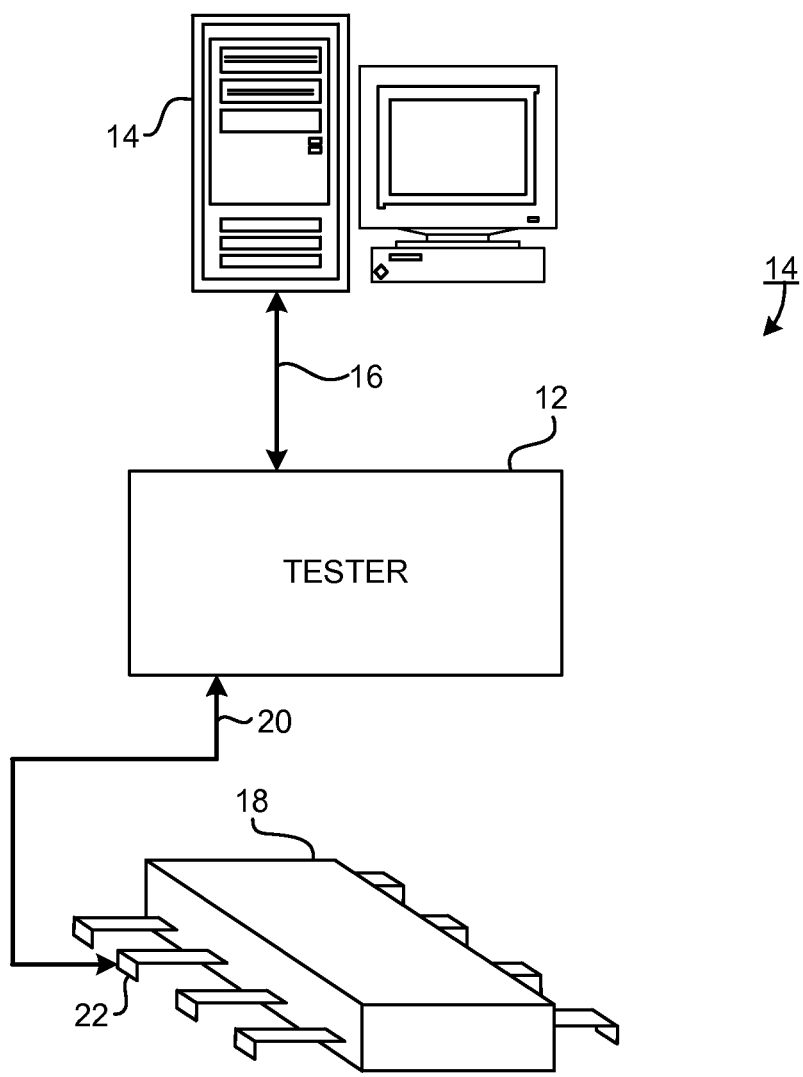
FIG. 1 is an example of an ATE test system.

Referring to FIG. 1, an example ATE system 10 for testing a DUT 18, such as a semiconductor device, includes a tester 12. To control tester 12, system 10 includes a computer system 14 that interfaces with tester 12 over a hardwire connection 16. In an example operation, computer system 14 sends commands to tester 12 to initiate execution of routines and functions for testing DUT 18. Such executing test routines may initiate the generation and transmission of test signals to the DUT 18 and collect responses from the DUT. Various types of DUTs may be tested by system 10. For example, DUTs may be semiconductor devices such as an integrated circuit (IC) chip (e.g., memory chip, microprocessor, analog-to-digital converter, digital-to-analog converter, etc.) or other devices.

To provide test signals and collect responses from the DUT, tester 12 is connected to an interface to the internal circuitry of DUT 18. For example, the DUT may be inserted into a socket in the tester, which contains interfaces to electrical connections between the DUT and the tester. A conductor 20 (e.g., one or more conductive pathways) is connected to the interface and is used to deliver test signals (e.g., AC or DC test signals, etc.) to the internal circuitry of DUT 18. Conductor 20 also senses signals in response to the test signals provided by tester 12. For example, a voltage signal or a current signal may be sensed at pin 22 in response to a test signal and sent over conductor 20 to tester 12 for analysis. Such single port tests may also be performed on other pins included in DUT 18. For example, tester 12 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 20 to pin 22 for storing a digital value on DUT 18. Once stored, DUT 18 may be accessed to retrieve and send the stored digital value over conductor 20 to tester 12. The retrieved digital value may then be identified to determine if the proper value was stored on DUT 18.

Along with performing single port measurements, a two-port test may also be performed by tester 12. For example, a test signal may be injected over conductor 20 into pin 22 and a response signal may be collected from one or more other pins of DUT 18. This response signal may be provided to tester 12 to determine quantities, such as gain response, phase response, and other throughput measurement quantities.

Figure 2:
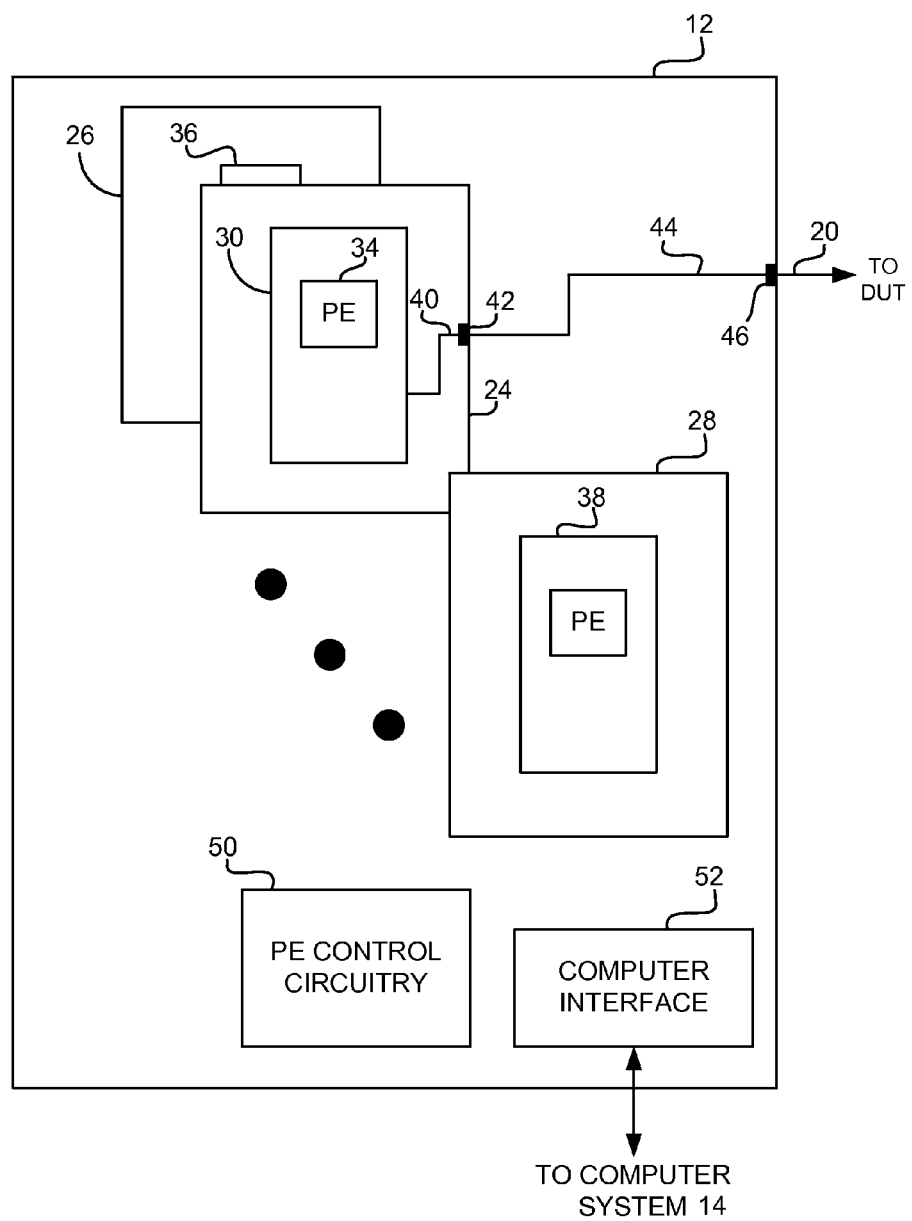
FIG. 2 is an example of circuitry included in the ATE.

Referring also to FIG. 2, to send and collect test signals from multiple connector pins of a DUT (or multiple DUTs), tester 12 includes an interface card 24 that can communicate with numerous pins. For example, interface card 24 may transmit test signals to, e.g., 32, 64, or 128 pins and collect corresponding responses. Each communication link to a pin is typically referred to as a channel and, by providing test signals to a number of channels, testing time is reduced since multiple tests may be performed simultaneously. Along with having many channels on an interface card, by including multiple interface cards in tester 12, the overall number of channels increases, thereby further reducing testing time. In this example, two additional interface cards 26 and 28 are shown to demonstrate that multiple interface cards may populate tester 12.

Each interface card includes one or more dedicated integrated circuit (IC) chips (e.g., an application specific integrated circuit (ASIC)) for performing particular test functions. For example, interface card 24 includes IC chip 30 for performing pin electronics (PE) tests. Specifically, IC chip 30 has a PE stage 34 that includes circuitry for performing PE tests. Additionally, interface cards 26 and 28 respectively include IC chips 36 and 38 that include PE circuitry. Typically, PE testing involves sending AC test signals, or waveforms, to a DUT (e.g., DUT 18) and collecting responses to further characterize the performance of the DUT. For example, IC chip 30 may transmit (to the DUT) AC test signals that represent a vector of binary values for storage on the DUT. Once these binary values have been stored, the DUT may be accessed by tester 12 to determine if the correct binary values have been stored. Since digital signals typically include abrupt voltage transitions, the circuitry in PE stage 34 on IC chip 30 operates at a relatively high speed in comparison to the other test circuitry (e.g., parametric measurement unit (PMU) circuitry, which is not shown in the figures). PE testing may also involve adding jitter to test signals and observing DUT operation in the presence of the jitter.

In this example implementation, to pass test signals from interface card 24 to DUT 18, one or more conducting traces 40 connect IC chip 30 to an interface board connector 42 that allows signals to be passed on and off interface board 24. Interface board connector 42 is also connected to one or more conductors 44 that are connected to an interface connector 46, which allow signals to be passed to and from tester 12. In this example, conductor(s) 20 are connected to interface connector 46 for bi-directional signal passage between tester 12 and pins of DUT 18. In some implementations, an interface device may be used to connect one or more conductors from tester 12 to the DUT. For example, the DUT (e.g., DUT 18) may be mounted onto a device interface board (DIB) for providing access to each DUT pin. In such an arrangement, conductor(s) 20 may be connected to the DIB for placing test signals on the appropriate pin(s) (e.g., pin 22) of the DUT.

In some implementations, conducting trace(s) 40 and conductor(s) 44 respectively connect IC chip 30 and interface board 24 for delivering and collecting signals. IC chip 30 (along with IC chips 36 and 38) may have multiple pins (e.g., eight, sixteen, etc.) that are respectively connected with multiple conducting traces and corresponding conductors for providing and collecting signals from the DUT (e.g., via a DIB). Additionally, in some implementations, tester 12 may connect to two or more DIB's for interfacing the channels provided by interface cards 24, 26, and 28 to one or multiple devices under test.

To initiate and control the testing performed by interface cards 24, 26, and 28, tester 12, PE control circuitry 50 provides test parameters (e.g., test signal voltage level, test signal current level, digital values, etc.) for producing test signals and analyzing DUT responses. The PE control circuitry may be implemented using one or more processing devices. Examples of processing devices include, but are not limited to, a microprocessor, a microcontroller, programmable logic (e.g., a field-programmable gate array), and/or combination(s) thereof. Tester 12 also includes a computer interface 52 that allows computer system 14 to control the operations executed by tester 12 and also allows data (e.g., test parameters, DUT responses, etc.) to pass between tester 12 and computer system 14.

The electrical paths between the PE and the DUT may have variability in their delay. As described herein, this may be due to different physical length paths, which may be dictated by packaging requirements, and/or equal physical length paths that have different electrical delays due, e.g., to variability of material characteristics. That is, the propagation delay per unit length may be different for different channel paths to the DUT. Timing calibration may be used to compensate for variable delay.

Figure 3:
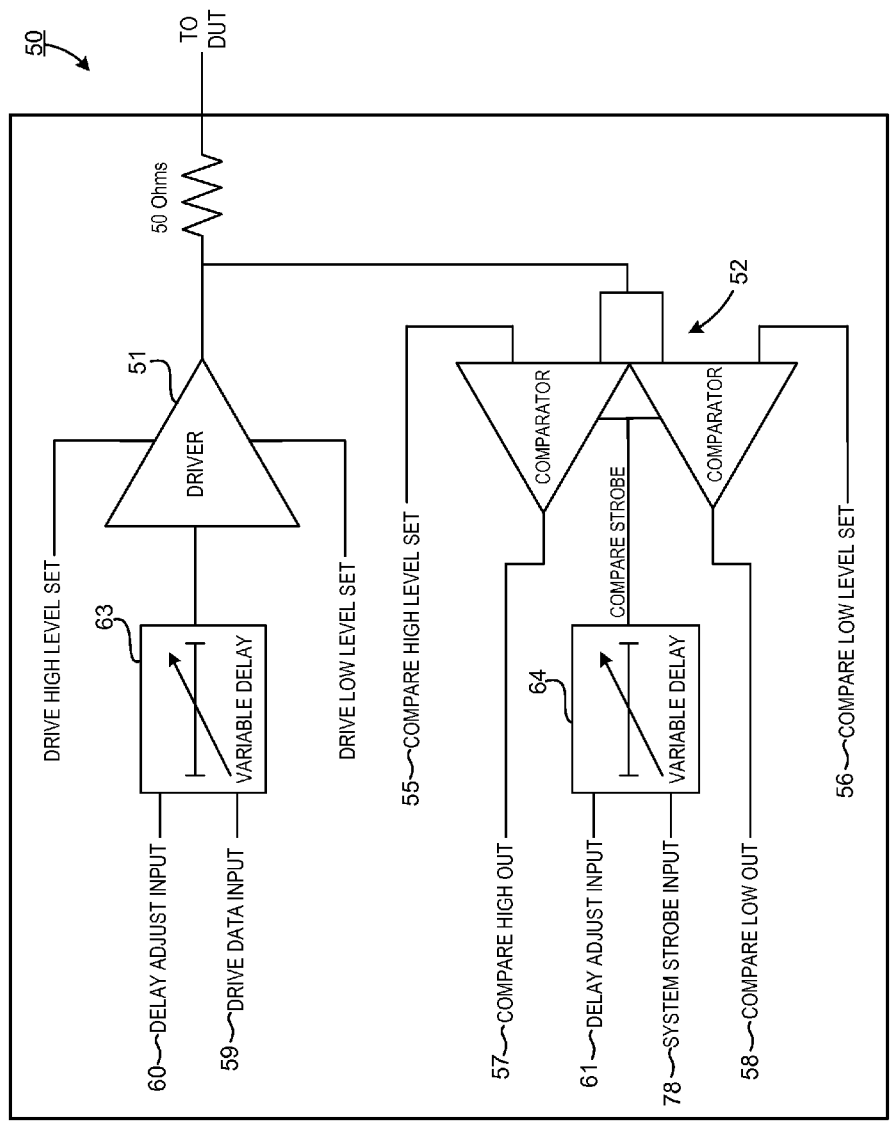
FIG. 3 is an example of circuitry included in pin electronics of the ATE.

More specifically, as explained above, an example ATE includes multiple channels, over which signals are sent between the ATE and a DUT. Referring to FIG. 3, in an example implementation, each such channel 50 includes a driver 51 and a comparator circuit 52. Driver 51 sends signals corresponding to data input 54 out to the DUT (not shown in FIG. 3). Comparator circuit 52 receives signals from the DUT, compares the received signals to known values 55, 56, and sends the outputs 57, 58 of such comparisons to processing circuitry inside of, or external to, the ATE. As noted, timing delays between channels can affect the accuracy of measurements made by the ATE. The channels may be calibrated to reduce such timing delays. Calibration may include, e.g., determining timing differences between two or more channels, and programming delays into channels that are deemed "faster" in order to substantially equalize the channels' transmission timings. These delays (e.g., "delay adjust input") 60, 61 may be programmed into the channels by programming data into one or both of variable delay element 63 (in the drive path of the channel) and variable delay element 64 (in the receive path of the channel). The programmed data adjusts the delay in a corresponding channel, thereby compensating for differences in delays between channels.

Figure 4:
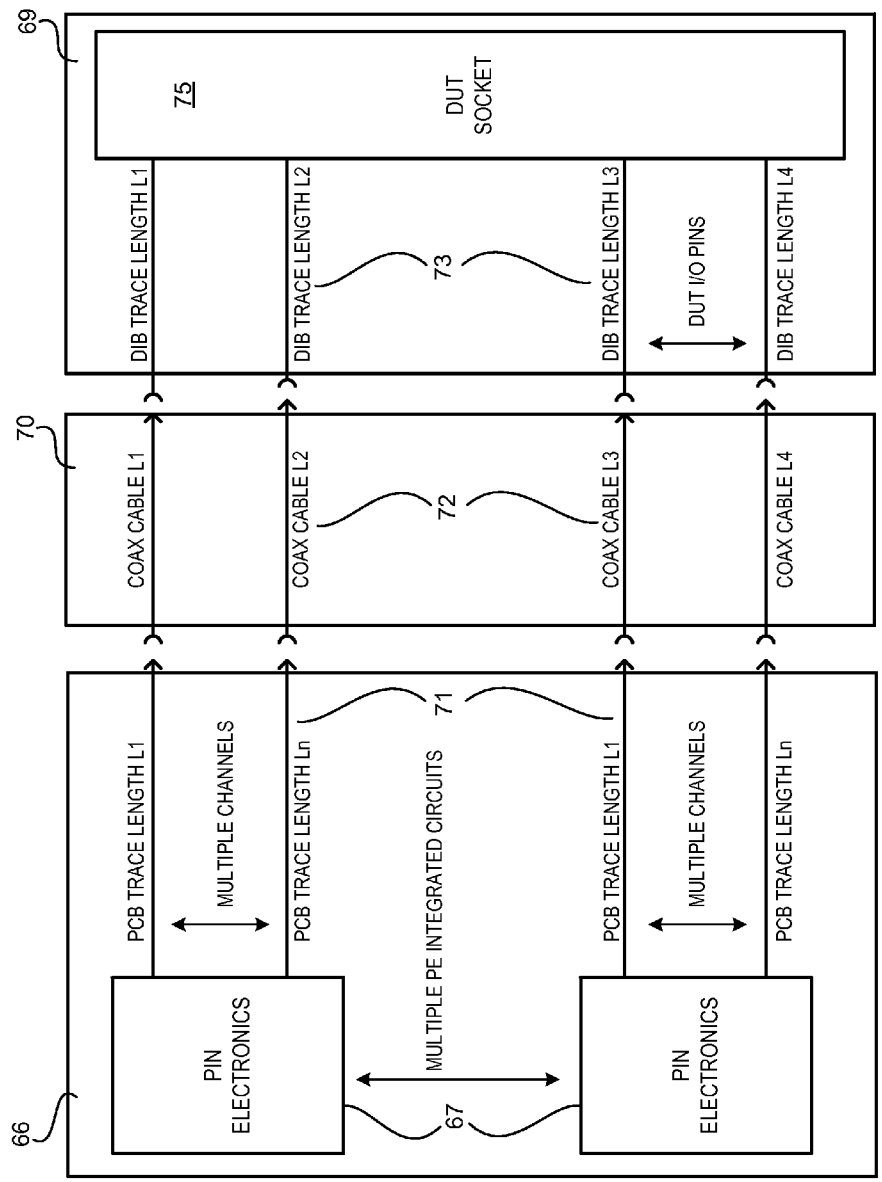
FIG. 4 is an example of connections between the ATE and a DUT socket.

FIG. 4 shows an example channel card 66 containing various PE boards 67 connected to a DIB 69 via an interface board 70. As shown in FIG. 4, the channel card contains traces 71 corresponding to different tester channels. Those traces interface to corresponding (coaxial) cables 72 on the interface board, and then to corresponding traces 73 on the DIB. In other implementations, the connection between PEs and the DUT socket may be different than that shown, e.g., the connection may be simpler or more complex. A DUT socket 75, into which a DUT may be inserted, is connected to the traces on the DIB via an interface connector (not shown), thereby enabling electrical pathways between PE circuitry in the tester and DUT socket 75.

In the example of FIG. 4, due to packaging issues, the PCB trace lengths on the channel card may not be of equal lengths. Even if PCB trace lengths 71 are equal, they may not be of equal electrical length due to different propagation delay per length. This may result from variability in materials included in the traces (e.g., PCB glass weave effects and others). Cables 72 may have similar electrical length differences and/or physical length differences. The same is true for DIB traces 73. While the delays resulting from the foregoing differences may be individually relatively small, in some implementations, the test system is to have very small (about five picoseconds or less) skew directly at the DUT input/output (I/O) pins. Accordingly, timing calibration may be used to adjust the delays of each channel and thereby compensate for (e.g., correct) the differences in delays.

To perform timing calibration, a calibration device may be inserted into DUT socket 75 in place of the DUT. An advantage of using a calibration device at the location of the DUT connection (e.g., in the DUT socket) is that calibration is done to the point where signals actually connect to the DUT I/O pins (e.g., in the socket). As a result, all elements in the connection path are included in calibration. To calibrate the PE receive delays, the calibration device connects between N (N≥1) DUT I/O pins. One of the pins may be driven by a channel drive circuit (e.g., a driver). Then, the other pins (N−1) signals electrically connect back to comparators in PE receive channels. Alternatively, the other pins (N−1) pins may drive signals and the one (Nth) pin electrically connects back to a comparator in a PE receive channel.

Varying the delay, a strobe 78 (FIG. 3) allows a consistent time offset between the channels to be determined. To calibrate PE drive delays, one of N channels is used as a receiver. One at a time, the other channels drive the calibration device. The skew between the different drive paths can be detected and the drive delays can be adjusted so that each path produces the same arrival time at the single receive channel. To calibrate the receive channel's drive path, the process shifts to a different receive channel and the process is repeated including the previous receive channel's drive path. This process is described in detail below.

Figure 5:
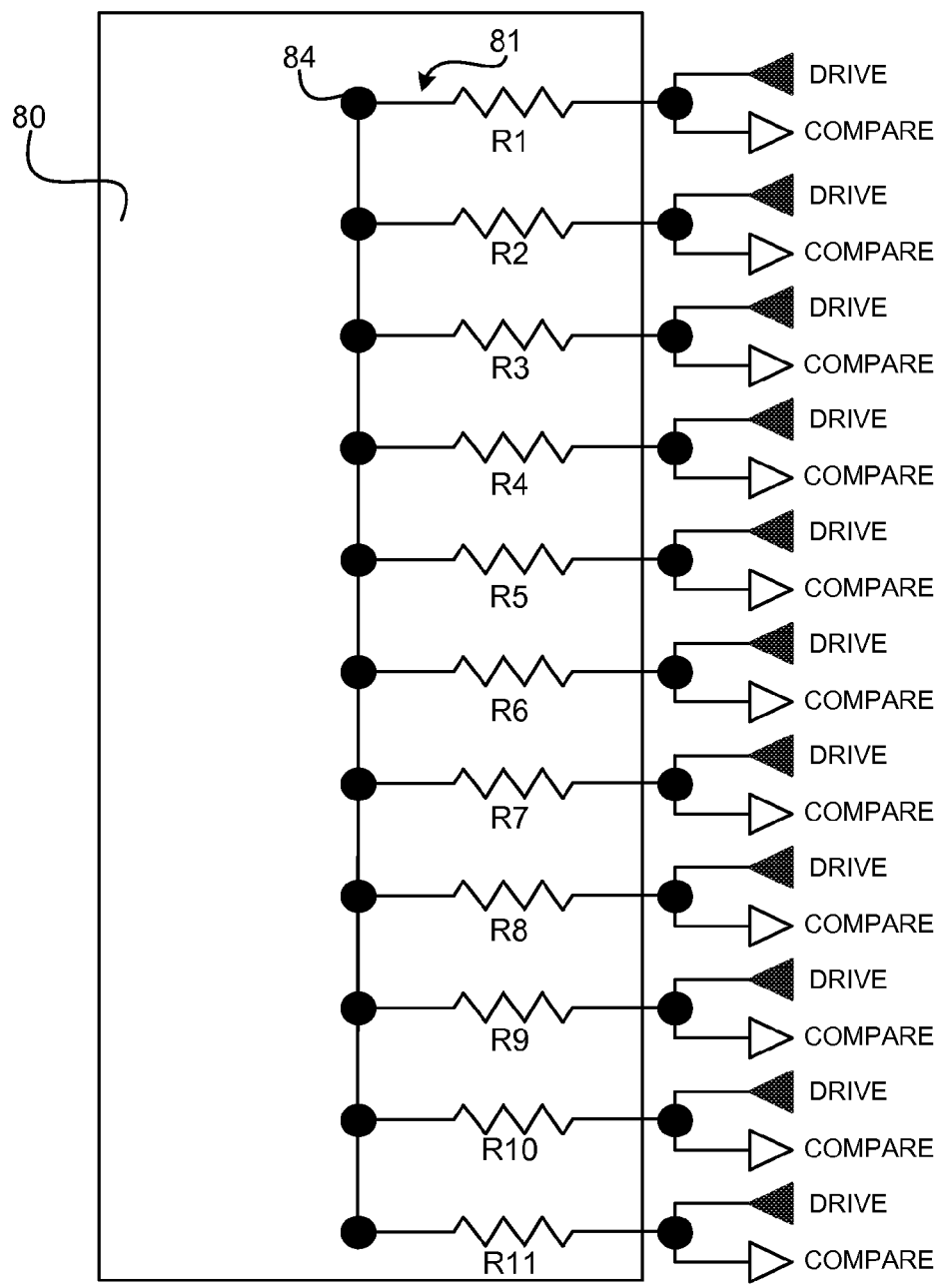
FIG. 5 is an example of a calibration device that may be used to perform timing calibration on the ATE.

An example of a calibration device 80 that may be used to perform the foregoing calibration process is shown in FIG. 5. In an example implementation, a resistive divider network of 1:N 81 (N≥1) connects one reference circuit path to N circuit paths via a common voltage node, resulting in a voltage divide of N (meaning that each receiver sees 1/Nth of the signal driven by any channel). As shown, the circuit paths (containing R1 to R11) of the calibration device connect to corresponding channels of the tester, which include drivers and comparators circuits such as those shown in, and described with respect to, FIG. 3.

In an example operation, the tester drives signals through resistor R1, and resistors R2 through R11 provide circuit paths back to comparators for deskew calibration. Any resistor (R) can be driven, e.g., the network is bi-directional so the network can be used to deskew drive or receive paths. Accordingly, signals can be driven through each of R2 through R11 into R1. In general, the concept is to use one tester channel (e.g., the channel connected to the circuit path containing R1) as a reference. The reference channel can act both as a driver (signal source) for calibration of the compare timings of the other channels, as well as a comparator for calibration of the drive timings of the other channels. Because a reference circuit path (e.g., the circuit path containing R1) is used either for driving or receiving, delays on that circuit path do not contribute to differences in delays between channels. As a result, deskewing can be performed by focusing on the delays through circuit paths containing R2 through R11. The delays may be measured at the receiving part of PE on each channel, and adjusted accordingly, e.g., by programming variable delay elements like those shown in FIG. 3. Once the circuit path containing R1 has been used as the reference path, the calibration process is repeated using the circuit path containing R2 as the reference, then the circuit path containing R3, and so forth, as described below.

More specifically, in an example implementation, signals are driven on a circuit path containing R1 and received on circuit paths containing R2 through R11. Then, signals are driven on a circuit path containing R2 and received on circuit paths containing R1 and R3 through R11. Then, signals are driven on a circuit path containing R3 and received on circuit paths containing R1, R2 and R4 through R11, and so forth. Alternatively, signals are driven on the circuit paths containing R1 through R10 and received on the circuit path containing R11. Then, signals are driven on the circuit paths containing R1 through R9 and R11 and received on the circuit path containing R10. Then, signals are driven on the circuit paths containing R1 through R8, R10 and R11 and received on the circuit path containing R9, and so forth. Combinations of signal transmitting and receiving through the calibration device are used to generate a calibration matrix, which is used to calibrate the test channels. The details of an example calibration process are descried below.

The individual resistors shown in FIG. 5 may be embedded resistors, surface-mounted resistors, thin-film resistors, or any combination of resistive elements. Alternatively, the resistors may be replaced with any appropriate embedded or non-embedded impedance-producing element(s). In some implementations, the calibration device may contain no specific resistors or impedance-producing element, but instead the individual resistors may be replaced with circuit traces without added impedance. In this regard, any appropriate circuit element may be included in the divider network used in the example calibration device.

As indicated above, in an example implementation, the divider network in the calibration device may be implemented with discrete devices (e.g. surface-mounted resistors) on a printed circuit board. Advantages of this type of device may include tighter impedance control, and reduced need for a special embedded laminate. Alternatively, the divider network may be implemented as a set of embedded devices (e.g., resistors) inside a printed circuit board (PCB) whose size matches the size of the DUT package to allow the calibration device to fit into the DUT socket. Thus for each type of DUT, a dedicated calibration device may be used for calibration that is sized to match, or substantially approximate, the size of the DUT.

In this regard, in some implementations, at least that portion of the device that makes connections to the contact points of the socket approximates the size of the DUT. While it may be desirable, in some implementations, to duplicate the actual DUT package, some implementations may use a larger device having a protrusion that will fit into the socket. In some cases, the implementations depend on the design of the socket or contact devices being used.

Example implementations that use a passive structure constructed of devices (e.g., resistors) embedded inside a standard printed circuit board and that match the physical dimensions of the DUT may also have the following advantages: enabling timing calibration of signals at the DUT location, without requiring modifications to the test setup (e.g., removal of the socket etc.) prior to calibration (e.g., the example calibration device thus effectively implements a test point inside the DUT socket, thereby enabling measurement of the signal timing that is actually seen by the DUT during test); enabling relatively tight delay matching (e.g., to five picoseconds or less); enabling usability in an existing DUT socket and tester because there is little need for a specific geometry, pin layout, or power supply since there is little or no active circuitry; and enabling mass production that is relatively inexpensive and that uses standard PCB fabrication techniques (since there are little or no discrete components, no assembly is necessary, and the resulting board is relatively rugged).

The impedance elements (e.g., resistors) may be chosen so that the entire combination of impedance elements along with the driver impedance and load impedance of the receiving channels produces a matched impedance network. For example. when a circuit path is driven from a 50 Ohm source and the remaining ten circuit paths are terminated in 50 Ohm loads, then the resistor values are calculated so that the entire combination of loads plus impedance elements presents a 50 Ohm load to match the driver 50 Ohm source. In this regard, to reduce reflections at the divider network tree, in an implementation that uses resistors or other impedance-producing devices, the impedance may be chosen in such a way that each path sees "X" (X≥1) Ohms impedance (assuming an "X" Ohm system) when looking into the divider. The impedance value, Z, is thus:

$$Z = X*(N-1)/(N+1),$$

where N is the number of impedance-producing elements in the divider network.

An example of a calibration process that uses the example calibration device of FIG. 5 is explained below. In this regard, ATE, such as that described herein, also may use TDR techniques to perform calibration. However, the TDR techniques alone may not produce the desired level of deskew (e.g., on the order of picoseconds). Accordingly, the calibration device described herein, along with the following corresponding process, may be used to supplement the TDR techniques, and produce the desired level of deskew (e.g., five picoseconds or less). In this regard, five picosecond or less is an example of a desired level of deskew; however, in some implementations, the desired level of deskew may be more or less than five picoseconds. Accordingly, the apparatus and processes described herein are not limited to producing deskew of five picoseconds or less.

To calibrate groups of channels, the calibration device of FIG. 5 is installed into the DUT socket. In this regard, the calibration device includes a physical and electrical interface that mates to a corresponding physical and electrical interface in the DUT socket. The calibration device connects a group of pre-selected bus pins together to a common point (voltage node 84) within the calibration device. In the example calibration device of FIG. 5, the channels are connected together to a common point within the calibration device through circuit paths in a matching resistor divider network. Any resistance can be driven, and the divider network is bi-directional and can be used to align drive and receive channels.

In an example operation, one of N+1 channels drives a voltage signal of (open-circuit) amplitude V into the group of channels. After the resistor divider network, the signal that reaches the 50 Ohm termination of each of the remaining N channel comparators will be V/2N. In an example of a 1:10 network, if 1.5 v (open-circuit) swing is driven by one channel (e.g., to the circuit path containing R2), the comparator for each of the remaining ten receive channels will see a 75 mv swing. This swing can be used to deskew the ten compare channels. In operation, one channel at a time is driven into the calibration device, and a binary search is performed using the rest of the compare channels. Since the tester drive and compare timing is aligned at the tester interface, the following equation relates the measured comparator timing $t_{cmp\_i\_j}$ to channel DIB lengths:

$$t_{cmp\_i\_j} + t_{DIB\_cal\_j} - t_{dib\_len\_j} = t_{drv\_prog} + t_{pd} - t_{DIB\_cal\_i} + t_{dib\_len\_i}$$

where $t_{cmp\_i\_j}$ is the comparator search time result for channel j when channel i is driving into the network; $t_{DIB\_cal\_j}$ and $t_{DIB\_cal\_i}$ are the TDR DIB calibration trace lengths for channels j and i respectively; $t_{dib\_len\_j}$ and $t_{dib\_len\_i}$ are the real DIB trace lengths; $t_{drv\_prog}$ is the drive program time; and $t_{pd}$ is the propagation delay through the network. After iterating through all drive channels, a system of equations relating drive time to compare time results is generated. The equations can be solved to obtain the real DIB trace lengths. This information may be used to calibrate the channels of the ATE.

In another example operation, N out of N+1 channel channels drive a voltage signal of (open-circuit) amplitude V simultaneously into the divider network. The remaining (N+1$^{th}$) channel is configured as a compare channel to observe the composite waveform from the divider network output. In this example, after the divider network, the signal that reaches the 50 Ohm termination of the compare channel will be V/2, and that signal that is independent of N. If a 1.5 v (open-circuit) swing is driven by N channels, the comparator for the receive channel will see a 750 mv swing.

The calibration process is as follows. One channel connected to the divider network of the calibration device is selected as the compare channel (e.g., the channel connected to the circuit path containing R1), and the remainder of the channels in the divider network are programmed to drive the same swing simultaneously into the divider network. The compare channel is terminated to a DC voltage through 50 Ohms and observes the composite drive waveform from the divider network. The compare time at 50% of the common drive waveform is recorded. The foregoing operations are repeated by selecting a different compare channel until there has been iteration all channels. The drive-to-compare channel skew can be calibrated-out by using the known propagation delay through the divider network. The calibration goal is to align the drive and compare channels so that all compare channels will find the drive waveform at the drive program time plus the propagation delay of the calibration device. In an example implementation, calibration may be performed by programming delays into variable delay elements.

The following equation is used to find the channel DIB length using the measured comparator timing $t_{cmp\_j}$:

$$t_{cmp\_j} + t_{DIB\_cal\_j} - t_{dib\_len\_j} = t_{drv\_prog} + t_{pd} - \sum_{\substack{i=0 \\ i \neq j}}^{N} \frac{1}{N}(t_{DIB\_cal\_i} - t_{dib\_len\_i})$$

where $t_{cmp\_j}$ is the comparator search time result for channel j when the other N channels are driving into the 1:N network; $t_{DIB\_cal\_j}$ and $t_{DIB\_cal\_i}$ are the DIB calibration trace lengths for channels j and i respectively; $t_{dib\_len\_j}$ and $t_{dib\_len\_i}$ are their real DIB lengths; $t_{drv\_prog}$ is the drive program time; and $t_{pd}$ is the propagation delay through the network. One assumption here is that the drive channels are reasonably aligned so that their transitions overlap, and the drive time of the composite waveform is the average time of all drive channels. After rearranging terms, a linear equation of DIB trace length for each compare channel j is obtained, as follows:

$$\sum_{\substack{i=0 \\ i \neq j}}^{N} \frac{1}{N}(t_{dib\_len\_i} - t_{DIB\_cal\_i}) + (t_{dib\_len\_j} - t_{DIB\_cal\_j}) = t_{cmp\_j} - t_{drv\_prog} - t_{pd}$$

For a 1:10 divider network, the following linear equations can be constructed from the above equation to determine the real DIB lengths:

$$\begin{bmatrix} 1.0 & 0.1 & 0.1 & 0.1 & 0.1 & 0.1 & 0.1 & 0.1 & 0.1 & 0.1 & 0.1 \\ 0.1 & 1.0 & 0.1 & 0.1 & 0.1 & 0.1 & 0.1 & 0.1 & 0.1 & 0.1 & 0.1 \\ 0.1 & 0.1 & 1.0 & 0.1 & 0.1 & 0.1 & 0.1 & 0.1 & 0.1 & 0.1 & 0.1 \\ 0.1 & 0.1 & 0.1 & 1.0 & 0.1 & 0.1 & 0.1 & 0.1 & 0.1 & 0.1 & 0.1 \\ 0.1 & 0.1 & 0.1 & 0.1 & 1.0 & 0.1 & 0.1 & 0.1 & 0.1 & 0.1 & 0.1 \\ 0.1 & 0.1 & 0.1 & 0.1 & 0.1 & 1.0 & 0.1 & 0.1 & 0.1 & 0.1 & 0.1 \\ 0.1 & 0.1 & 0.1 & 0.1 & 0.1 & 0.1 & 1.0 & 0.1 & 0.1 & 0.1 & 0.1 \\ 0.1 & 0.1 & 0.1 & 0.1 & 0.1 & 0.1 & 0.1 & 1.0 & 0.1 & 0.1 & 0.1 \\ 0.1 & 0.1 & 0.1 & 0.1 & 0.1 & 0.1 & 0.1 & 0.1 & 1.0 & 0.1 & 0.1 \\ 0.1 & 0.1 & 0.1 & 0.1 & 0.1 & 0.1 & 0.1 & 0.1 & 0.1 & 1.0 & 0.1 \\ 0.1 & 0.1 & 0.1 & 0.1 & 0.1 & 0.1 & 0.1 & 0.1 & 0.1 & 0.1 & 1.0 \end{bmatrix} \begin{bmatrix} t_{dib\_len\_0} - t_{DIB\_cal\_0} \\ t_{dib\_len\_1} - t_{DIB\_cal\_1} \\ t_{dib\_len\_2} - t_{DIB\_cal\_2} \\ t_{dib\_len\_3} - t_{DIB\_cal\_3} \\ t_{dib\_len\_4} - t_{DIB\_cal\_4} \\ t_{dib\_len\_5} - t_{DIB\_cal\_5} \\ t_{dib\_len\_6} - t_{DIB\_cal\_6} \\ t_{dib\_len\_7} - t_{DIB\_cal\_7} \\ t_{dib\_len\_8} - t_{DIB\_cal\_8} \\ t_{dib\_len\_9} - t_{DIB\_cal\_9} \\ t_{dib\_len\_10} - t_{DIB\_cal\_10} \end{bmatrix} = \begin{bmatrix} t_{cmp\_0} - \\ t_{drv\_prog} - t_{pd} \\ t_{cmp\_1} - \\ t_{drv\_prog} - t_{pd} \\ t_{cmp\_2} - \\ t_{drv\_prog} - t_{pd} \\ t_{cmp\_3} - \\ t_{drv\_prog} - t_{pd} \\ t_{cmp\_4} - \\ t_{drv\_prog} - t_{pd} \\ t_{cmp\_5} - \\ t_{drv\_prog} - t_{pd} \\ t_{cmp\_6} - \\ t_{drv\_prog} - t_{pd} \\ t_{cmp\_7} - \\ t_{drv\_prog} - t_{pd} \\ t_{cmp\_8} - \\ t_{drv\_prog} - t_{pd} \\ t_{cmp\_9} - \\ t_{drv\_prog} - t_{pd} \\ t_{cmp\_10} - \\ t_{drv\_prog} - t_{pd} \end{bmatrix}$$

During the first iteration to solve the foregoing linear equations, DIB calibration values from TDR calibration are used. After the new DIB lengths are determined, they are applied back the tester to correct the drive and compare timing, and those lengths are used as the new DIB calibration values for the next iteration. In this regard, DIB trace length (e.g., element 73 of FIG. 4) is a term indicative of the overall calibration deskew values and is added-in with other calibration terms when performing calibration. Anything prior to the DIB (e.g., traces on channel card 66 or cables on board 70 of FIG. 4) is typically already accounted-for in other (e.g., factory and job) independent calibrations. In other implementations, this may not be the case, and the calibration device may be used to correct for deskew caused by all wires to/from the DUT or any appropriate subset thereof.

While this specification describes example implementations related to "testing" and a "test system," the devices and method described herein may be used to calibrate any appropriate system, and are not limited to calibrating test systems or to calibrating the example test systems described herein.

Testing and calibration performed as described herein may be implemented using hardware or a combination of hardware and software. For example, a test system like the ones described herein may include various controllers and/or processing devices located at various points. A central computer may coordinate operation among the various controllers or processing devices. The central computer, controllers, and processing devices may execute various software routines to effect control and coordination of testing and calibration.

The testing and calibration can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing and calibration can be performed by one or more programmable processors executing one or more computer programs to perform the functions described herein. All or part of the testing and calibration can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass PCBs for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a connection that includes intervening components but that nevertheless allows electrical signals to flow between connected components. Any "connection" involving electrical circuitry mentioned herein, unless stated otherwise, is an electrical connection and not necessarily a direct physical connection regardless of whether the word "electrical" is used to modify "connection". Elements of different implementations described herein may be combined to form other embodiments not specifically set forth above. Elements may be left out of the structures described herein without adversely affecting their operation.

Furthermore, various separate elements may be combined into one or more individual elements to perform the functions described herein.

What is claimed is:

1. An apparatus for use in calibration of a test system comprising multiple channels and a socket for receiving a device under test, the apparatus comprising:
    a device interface that is connectable to the socket; and
    multiple circuit paths, each circuit path being connectable, through the device interface, to a corresponding channel of the test system and being connected to a common node;
    wherein the apparatus is configured so that, during calibration, signals either (i) each pass from the test system, through one of the multiple circuit paths, and back to the test system through others of the multiple circuit paths, or (ii) each pass from the test system, through the others of the multiple circuit paths, and back to the test system through the one of the multiple circuit paths.

2. The apparatus of claim 1, wherein the others of the multiple circuit paths comprise all of the multiple circuit paths except the one of the multiple circuit paths.

3. The apparatus of claim 1, wherein, in a case that signals each pass from the test system, through one of the multiple circuit paths: successive signals pass back to the test system through different ones of the multiple circuit paths.

4. The apparatus of claim 1, wherein, in a case that signals each pass from the test system, through the others of the multiple circuit paths: successive signals pass through different ones of the others of the multiple circuit paths.

5. The apparatus of claim 1, wherein each of the multiple circuit paths comprises a circuit trace.

6. The apparatus of claim 1, wherein each of the multiple circuit paths comprises an impedance element.

7. The apparatus of claim 6, wherein the impedance element comprises a resistor that is part of a resistive divider network that includes the common node.

8. The apparatus of claim 6, wherein the resistor is chosen from a group consisting of embedded resistors, surface-mounted resistors, and thin-film resistors.

9. The apparatus of claim 6, wherein a combination of impedance elements along with driver impedance and load impedance of receiving channels comprises a matched impedance network.

10. The apparatus of claim 1, wherein the apparatus has a package size that is the same as a package size of the device under test.

11. The apparatus of claim 1, wherein calibration comprises aligning timing of channels by varying timing using pin electronics in the test system.

12. The apparatus of claim 11, wherein the apparatus calibrates channels in the test system so that the channels of the test system have a timing misalignment of, at most, five picoseconds.

13. A test system comprising:
    channels for sending signals to, and receiving signals from, a device under test (DUT);
    each channel comprising pin electronics to send test signals to the DUT and to receive response signals from the DUT, each channel comprising at least one variable delay element to adjust a timing of a corresponding channel;
    a socket to interface the channels to the DUT; and
    a calibration device connected in the socket in place of the DUT, the calibration device for calibrating the test system, the calibration device comprising:
        a device interface that is connectable to the socket; and
        multiple circuit paths, each circuit path being connectable, through the device interface, to a corresponding channel of the test system and being connected to a common node;
        wherein the apparatus is configured so that, during calibration, signals either (i) each pass from the test system, through one of the multiple circuit paths, and back to the test system through others of the multiple circuit paths, or (ii) each pass from the test system, through the others of the multiple circuit paths, and back to the test system through the one of the multiple circuit paths.

14. The apparatus of claim 13, wherein the others of the multiple circuit paths comprise all of the multiple circuit paths except the one of the multiple circuit paths.

15. The test system of claim 13, wherein the pin electronics of each channel comprises a pin driver for outputting the test signals and a comparator circuit for receiving the test signals.

16. The test system of claim 13, wherein, in a case that signals each pass from the test system, through one of the multiple circuit paths: successive signals pass back to the test system through different ones of the multiple circuit paths.

17. The test system of claim 13, wherein, in a case that signals each pass from the test system, through the others of the multiple circuit paths: successive signals pass through different ones of the others of the multiple circuit paths.

18. The apparatus of claim 13, wherein each of the multiple circuit paths comprises a circuit trace.

19. The apparatus of claim 13, wherein each of the multiple circuit paths comprises an impedance element.

20. The apparatus of claim 19, wherein the impedance element comprises a resistor that is part of a resistive divider network that includes the common node.

21. The apparatus of claim 19, wherein a combination of impedance elements along with driver impedance and load impedance of receiving channels comprises a matched impedance network.

22. The apparatus of claim 13, wherein the calibration device has a package size that is the same as a package size of the DUT.

23. The apparatus of claim 13, wherein calibration comprises aligning timing of a channel by changing delay provided by a variable delay element in the channel.

24. The apparatus of claim 23, wherein the calibration device calibrates channels in the test system so that the channels of the test system have a timing misalignment of, at most, five picoseconds.

25. A method of calibrating a test system comprising multiple channels and a socket for receiving a device under test, the method using an apparatus comprising:
- a device interface that is connectable to the socket; and
- multiple circuit paths, each circuit path being connectable, through the device interface, to a corresponding channel of the test system and being connected to a common node;

wherein the method comprises:
- passing signals from the test system such that each signal passes through one of the multiple circuit paths, and back to the test system through others of the multiple circuit paths;
- determining timing information based on passage of the signals; and
- determining calibration information based on the timing information.

26. The method of claim 25, wherein the others of the multiple circuit paths comprise all of the multiple circuit paths except the one of the multiple circuit paths.

27. The method of claim 25, wherein determining the timing information comprises incorporating the timing information into a system of equations, and solving for the calibration information by solving the system of equations.

28. A method of calibrating a test system comprising multiple channels and a socket for receiving a device under test, the method using an apparatus comprising:
- a device interface that is connectable to the socket; and
- multiple circuit paths, each circuit path being connectable, through the device interface, to a corresponding channel of the test system and being connected to a common node;

wherein the method comprises:
- passing signals from the test system such that each signal passes through a set of the multiple circuit paths, and back to the test system through the one of the multiple circuit paths;
- determining timing information based on passage of the signals; and
- determining calibration information based on the timing information.

29. The method of claim 28, wherein the set of the multiple circuit paths comprises all of the multiple circuit paths except the one of the multiple circuit paths.

30. The method of claim 28, wherein determining the timing information comprises incorporating the timing information into a system of equations, and solving for the calibration information by solving the system of equations.

* * * * *